United States Patent [19]

Hernandez

[11] Patent Number: 4,754,366
[45] Date of Patent: * Jun. 28, 1988

[54] DECOUPLING CAPACITOR FOR LEADLESS SURFACE MOUNTED CHIP CARRIER

[75] Inventor: Jorge M. Hernandez, Mesa, Ariz.

[73] Assignee: Rogers Corporation, Rogers, Conn.

[*] Notice: The portion of the term of this patent subsequent to Apr. 14, 2004 has been disclaimed.

[21] Appl. No.: 27,932

[22] Filed: Mar. 19, 1987

Related U.S. Application Data

[63] Continuation-in-part of Ser. No. 763,826, Aug. 8, 1985, Pat. No. 4,658,327, which is a continuation-in-part of Ser. No. 693,189, Jan. 22, 1985, abandoned.

[51] Int. Cl.$^4$ .............. H01G 1/14; H01G 4/10; H05K 7/10
[52] U.S. Cl. .................... 361/306; 361/321; 361/403
[58] Field of Search ............ 361/306, 321, 403

[56] References Cited

U.S. PATENT DOCUMENTS 3,264,709  8/1966  Lupfer .................. 361/321 X
3,271,507  9/1966  Elliott .................. 361/403 X
4,494,169  1/1985  Watson .................. 361/306

Primary Examiner—Donald A. Griffin
Attorney, Agent, or Firm—Fishman, Dionne & Cantor

[57] ABSTRACT

High frequency noise is decoupled from power supplied to a surface mounted integrated circuit (IC) leadless chip carrier package by installation of a surface mounted decoupling capacitor over the IC chip carrier package and printed circuit board. The decoupling capacitor comprises a dielectric material sandwiched between a pair of conductors and having a plurality of leads extending from each conductor. In accordance with the present invention, the decoupling capacitor is individually dimensioned and configured to fit over a surface mounted integrated circuit (IC) leadless chip carrier package and correspond to the power and ground pin configuration of that package.

13 Claims, 16 Drawing Sheets

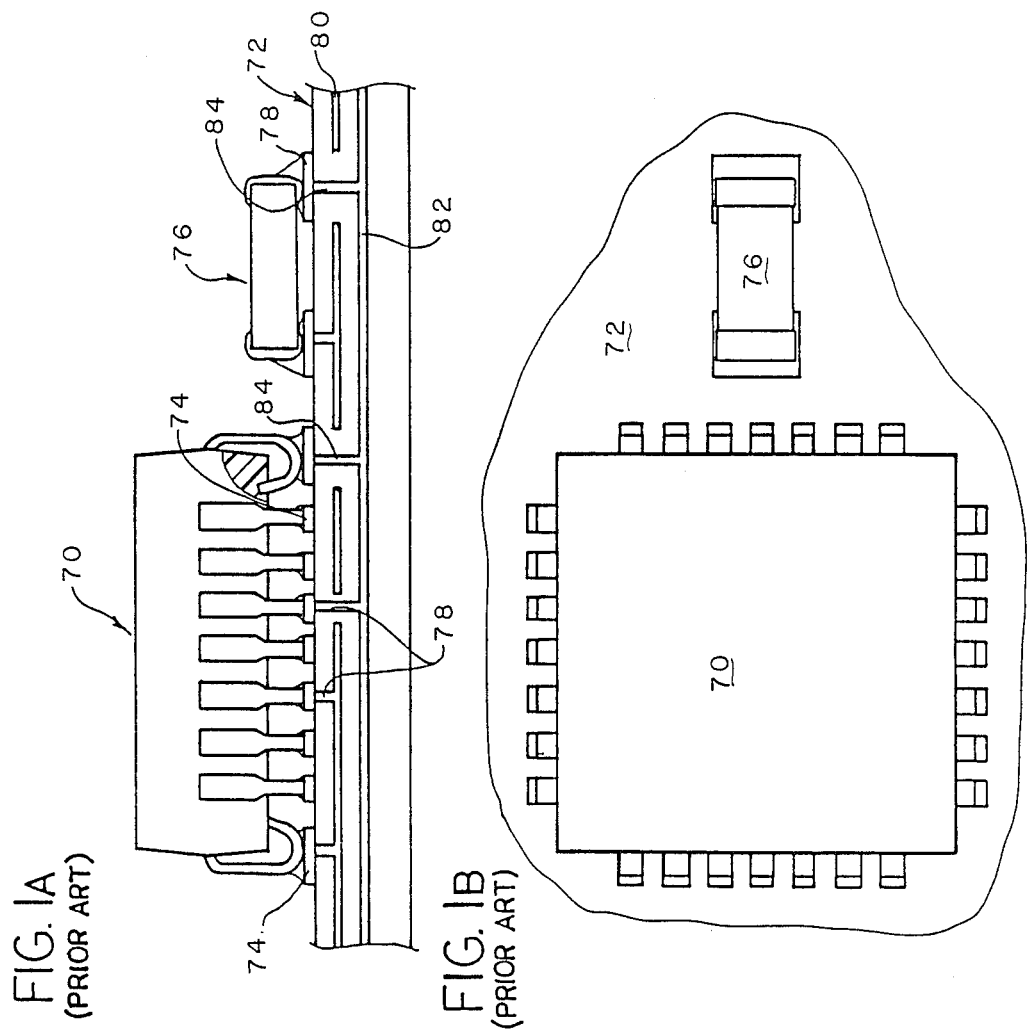

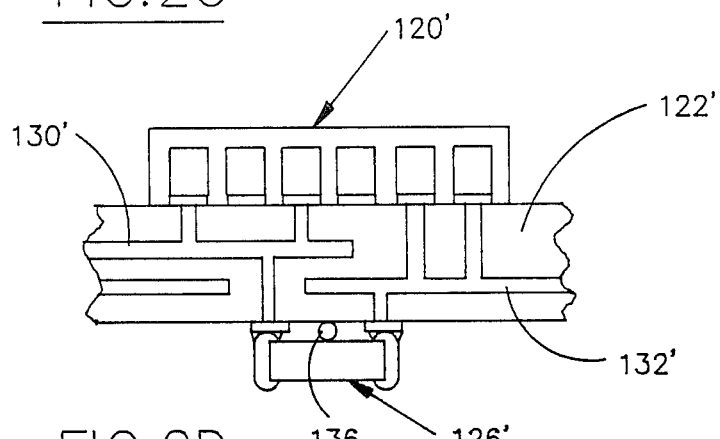
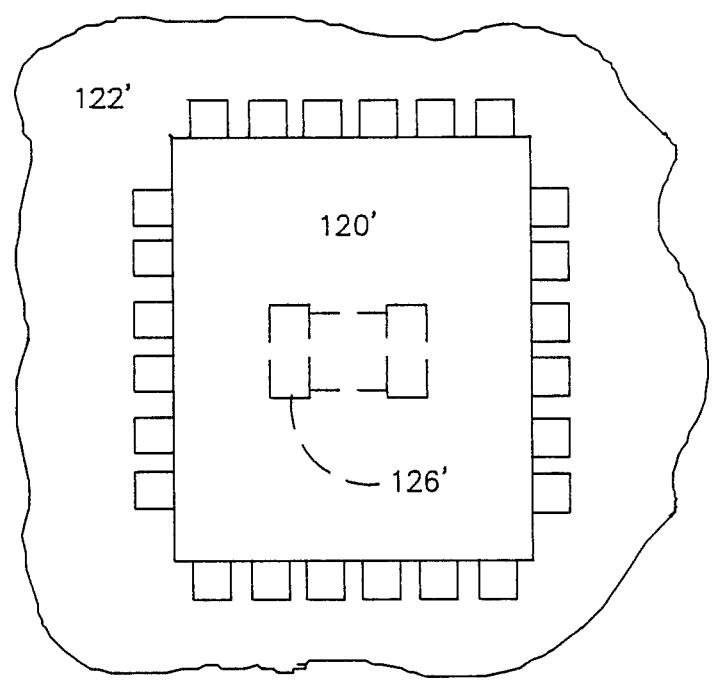

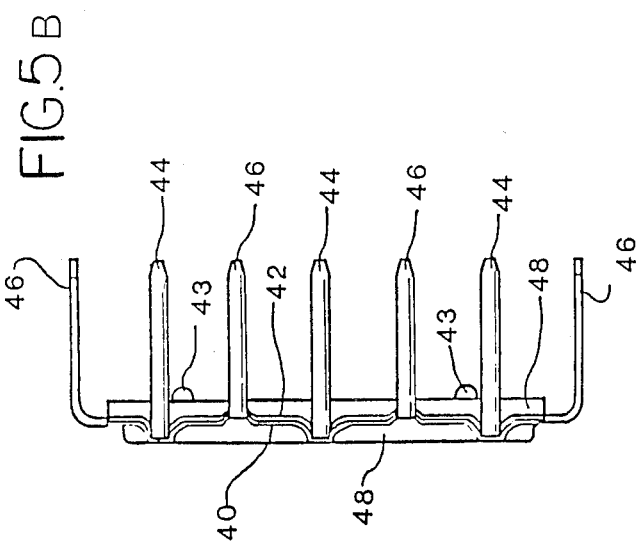
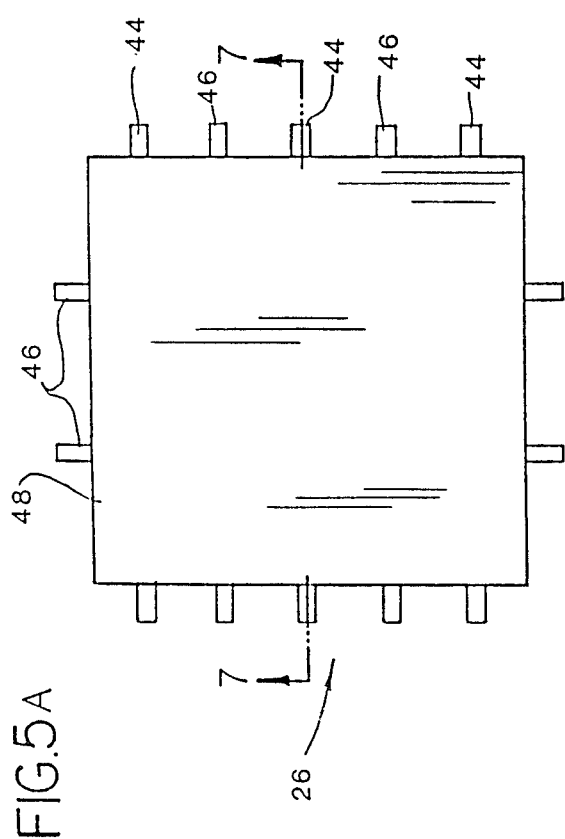
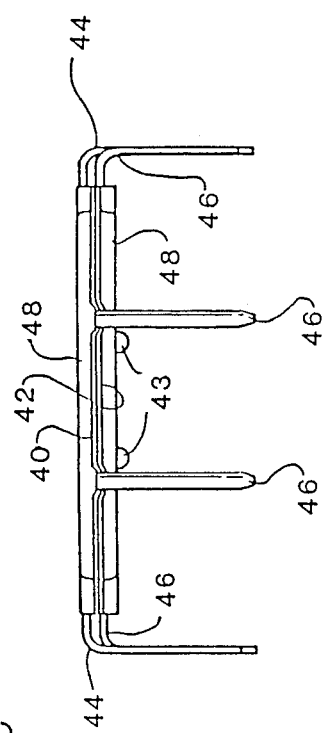

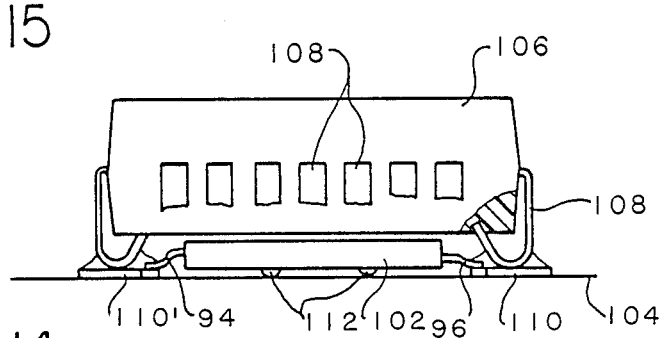
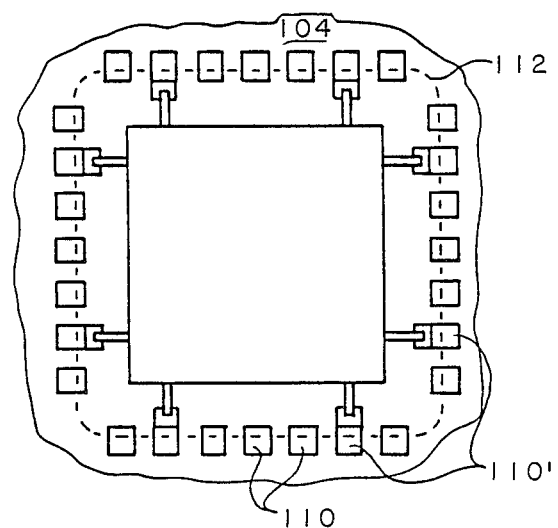

DECOUPLING CAPACITOR FOR LEADLESS SURFACE MOUNTED CHIP CARRIER

This application is a continuation-in-part of U.S. Application Serial Number 763,826 filed August 8, 1985, now U.S. Patent No. 4,658,327 issued April 14, 1987, which, in turn, is a continuation-in-part of U.S. Application Serial No. 693,189 filed January 22, 1985, now abandoned.

BACKGROUND OF THE INVENTION

This invention relates to the field of decoupling capacitors for integrated circuits. More particularly, this invention relates to novel and improved decoupling capacitors especially suitable for use in conjunction with Pin Grid Array (PGA) type integrated circuit packages and surface mounted plastic leadless and leaded chip carrier packages for surface mounting integrated circuits.

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and ground leads of the IC. One connection scheme utilizes a capacitor which is mounted on a multilayer printed circuit board, outside the integrated circuit with plated through holes used to connect the capacitor to the internal power and ground planes, which in turn make contact with the power supply connection leads of the integrated circuit. A less preferred method (in terms of higher inductance) is to interconnect the decoupling capacitor and integrated circuit power and ground leads via traces on either a multilayer or double sided printed circuit board.

The above two decoupling techniques suffer from several deficiencies. The most serious of these deficiencies resides in the fact that the circuits, including the capacitors, become highly inductive at high frequencies as a consequence of the shape and length of the leads and interconnection traces between the discrete capacitor and the integrated circuit which it decouples. In fact, the inductance of the leads and printed circuit board traces may be sufficiently high to nullify the high frequency effect of the capacitor in the circuit. A second serious deficiency resides in the spatial inefficiency incident to employing a capacitor adjacent to the integrated circuit. The space requirements i.e., real estate, of the decoupling capacitor and the interconnection traces on the printed circuit board adversely affect the optimum component packaging density which can be achieved on the board.

In an effort to overcome the above-discussed deficiencies associated with the use of decoupling capacitors mounted on a printed circuit board, a decoupling capacitor which is adapted to be mounted underneath a conventional dual-in-line circuit has been proposed. U.S. Pat. No. 4,502,101 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has two electrically active leads from the metallized coatings on opposite sides of the chip at two points adjacent a pair of diagonally opposed corners of the rectangularly shaped ceramic chip. The capacitor may also contain two or more electrically inactive dummy leads. The two active (and dummy) leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two electrically active leads from the decoupling capacitor are plugged into a printed circuit board, with these leads from the capacitor being inserted into the printed circuit through holes to which the ground power and supply conductors are connected. The associated integrated circuit or other electronic component is then positioned over the capacitor and inserted into the board such that the power supply leads of the integrated circuit or other component will be positioned in the same through holes of the printed circuit board in which the two electrically active capacitor leads have been inserted.

U.S. Pat. No. 4,636,918, which is also assigned to the assignee hereof and incorporated herein by reference, discloses a decoupling capacitor of the type described in U.S. Pat. No. 4,502,101 and which is similarly mounted in the same through holes as the power and ground supply conductors of the DIP integrated circuit package. However, in contrast to the assembly shown in U.S. Pat. No. 4,502,101, the decoupling capacitor of U.S. Pat. No. 4,636,918 is mounted either over the integrated circuit package; or on the opposed side of the circuit board (relative to the IC package) in alignment with the integrated circuit package.

While suitable for its intended purposes, the decoupling capacitors described in U.S. Pat. Nos. 4,502,101 and 4,636,918 are not particularly adapted to be used in conjunction with Pin Grid Array (PGA) type integrated circuit packages or either leaded or leadless surface mounted chip carrier type integrated circuit packages. PGA packaging and surface mounted plastic chip carriers (of the leaded or leadless type) are becoming a commonly used IC packaging technology. As with conventional dual-in-line packages, PGA packages and surface mounted plastic leaded or leadless chip carriers require similar decoupling across the power and ground leads. However, decoupling capacitors of the type disclosed in the prior patents have a structure and configuration which preclude their usage in conjunction with the distinctive configuration of well known PGA packages and surface mounted plastic leaded or leadless chip carriers.

SUMMARY OF THE INVENTION

The above-discussed deficiencies and drawbacks of prior art decoupling capacitors are overcome or alleviated by the novel decoupling capacitor of the present invention. In accordance with the present invention, several embodiments of flat decoupling capacitors adapted for mounting directly under a Pin Grid Array package and a surface mounted plastic leaded chip carrier, respectively; or over a surface mounted leadless chip carrier, is provided which will result in a lower decoupling loop, thus providing a more effective decoupling scheme. The capacitors of the present invention also contribute to a savings in board space, i.e., they take up less "real estate" on the printed circuit board, by resting entirely under either the PGA package or the surface mounted plastic leaded chip carrier, or over the leadless chip carrier.

In a first embodiment, a decoupling capacitor for use in conjunction with PGA packages comprises a dielectric material, sandwiched between a pair of conductors. A plurality of leads are provided along the periphery of each conductor. These leads extend outwardly a short distance generally in the plane of the metal conductors to which they are attached and are then bent downwardly so as to extend in a direction which is perpendicular to the planes of the conductors. The entire assembly, with the exception of the plural transversely extending lead portions, may then be encapsulated within a suitable nonconductive material. The decoupling capacitor assembly described above is specifically sized and configured so as to be received in the space directly below the integrated circuit chip and between the downwardly extending pins of a PGA package. It is well known that PGA packages have many different types of pin configurations. Accordingly, the present invention has flexible lead locations and multiple pins from each voltage level of the PGA so as to be tailored to a particular PGA package.

In a second embodiment of the present invention, a decoupling capacitor for use in conjunction with a plastic leaded chip carrier package comprises a dielectric material sandwiched between top and bottom conductors and encapsulated by a suitable outer insulating material. Each conductor has a plurality of leads extending outwardly therefrom, exterior of the insulating material, and formed for surface mounting. This surface mountable decoupling capacitor is specifically sized and configured so as to be received in the space under the leaded chip carrier and between the downwardly extending leads of the leaded chip carrier. The capacitor preferably has multiple surface mountable leads to service the multiple power and ground leads of the leaded chip carrier. In a third embodiment of the present invention, a decoupling capacitor for use in conjunction with a leadless chip carrier package comprises a dielectric material sandwiched between to and bottom conductors and encapsulated by a suitable outer insulating material. Each conductor has a plurality of leads extending outwardly therefrom, exterior of the insulating material, and adapted for surface mounting. This surface mountable decoupling capacitor is specifically sized and configured so as to be positioned over the leadless chip carrier in those areas corresponding to power and ground solder connects on the chip carrier. The capacitor preferably has multiple leads to service the multiple power and ground solder connects of the leadless chip carrier.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 1A is a side elevation view of a "leaded" surface mounted IC chip carrier package connected to a ceramic capacitor via plated through holes and internal planes in accordance with the prior art;

FIG. 1B is a plan view of the IC package and capacitor arrangement shown in FIG. 1A;

FIG. 2C is a side elevation view of a "leadless" surface mounted IC chip carrier package connected to a ceramic capacitor on the backside of a printed circuit board in accordance with the present invention;

FIG. 2D is a plan view of the IC package and capacitor arrangement shown in FIG. 2C;

FIG. 5A is a plan view of a decoupling capacitor for use in conjunction with a Pin Grid Array package in accordance with the present invention;

FIG. 5B is a side elevation view along the line B—B of FIG. 5A.

FIG. 5C is a side elevation view along the line C—C of FIG. 5A.

FIG. 14 is a plan view of a portion of a circuit board having the surface mountable decoupling capacitor of FIGS. 11–13 mounted thereon;

FIG. 15 is a side elevation view of the surface mountable decoupling capacitor of FIGS. 11–13 mounted underneath a surface mounted IC chip carrier package in accordance with the present invention;

DESCRIPTION OF THE PREFERRED EMBODIMENT

Figure 1:
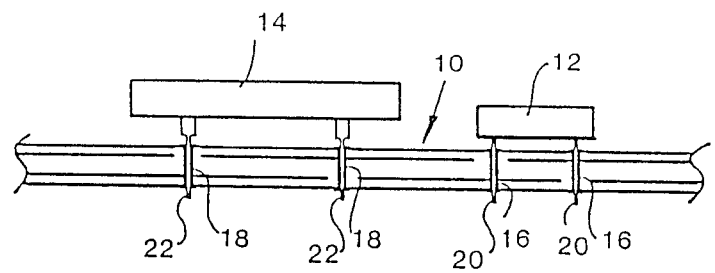
FIG. 1 is a side view of a Pin Grid Array package connected to a multilayer ceramic capacitor via plated through holes and internal planes in accordance with the prior art.
Figure 2:
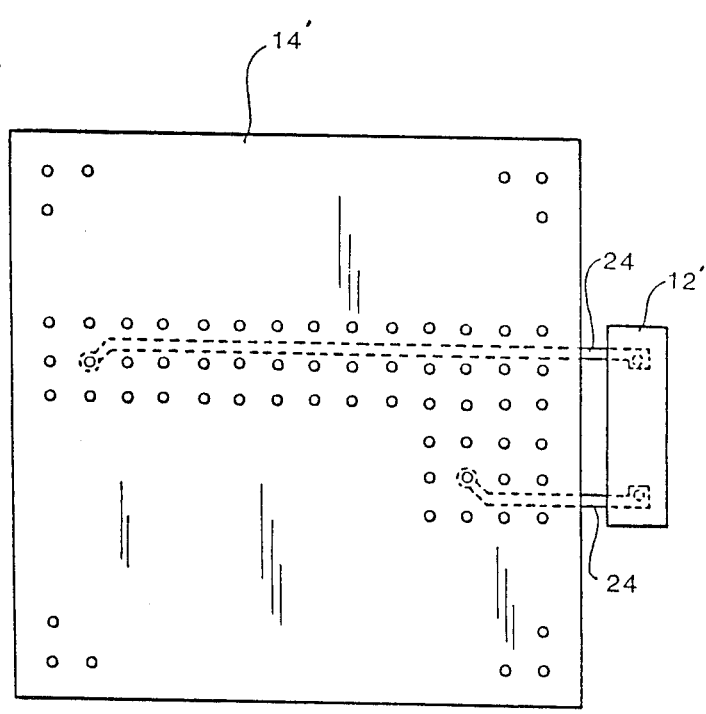
FIG. 2. is a plan view of a Pin Grid Array package connected to a multilayer ceramic capacitor via printed circuit traces in accordance with the prior art.

Referring first to prior art FIG. 1, a multilayer printed circuit board 10 is shown having a multilayer ceramic capacitor 12 and a Pin Grid Array (PGA) package 14 mounted thereon. Capacitor 12 is mounted outside PGA package 14 and plated through holes 16 and 18 are used to connect the capacitor leads 20 to the power and ground leads 22 of the PGA package 14. Prior art FIG. 2 shows a less effective decoupling scheme wherein printed circuit traces 24 are used to connect power and ground leads of the PGA package 14' with the decoupling capacitor 12'.

As discussed earlier, the prior art decoupling schemes of FIGS. 1 and 2 both suffer from serious deficiencies and drawbacks including high inductance in the leads and printed circuit board traces (especially in the FIG. 2 assembly) as well as inefficient use of board real estate which adversely affects component packaging density.

Figure 3:
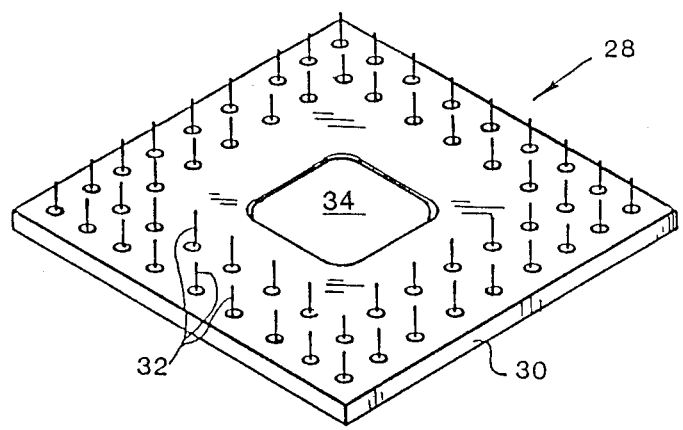
FIG. 3 is a perspective view of pin Grid Array package.
Figure 4:
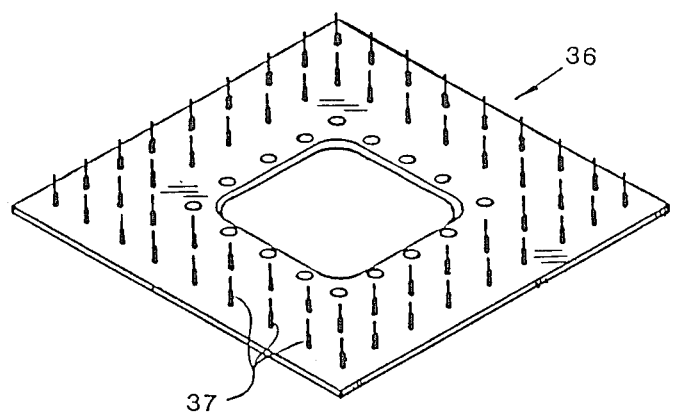
FIG. 4 is a plan view of a pin Grid Array socket.

These important problems are overcome by the decoupling capacitor of the present invention which is dimensioned and configured specifically to be used in conjunction with Pin Grid Array packages. Referring first to FIGS. 3 and 4, a typical PGA package is shown generally at 28. Pin Grid Array package such as that shown in FIGS. 3 and 4 are well known to those skilled in the art and comprise a square or rectangular base portion 30 having a plurality of pins 32 in an array or pattern extending therefrom. The pins may be of several types including signal pins, power and ground pins and alignment pins. Generally, the power and ground pins 32 of PGA package 28 are located about the inner periphery of the pin array (i.e., the inner rings of pins) and surround the center area 34. The center of the PGA package has no pins extending therefrom and is defined as the chip cavity area 34. Chip cavity area 34 receives an integrated circuit chip (not shown) to complete the PGA package. It is well known that the pin configuration and overall sizing of PGA packages may differ significantly from one part to the next depending upon the particular electronic requirements. It will be appreciated then, that while a PGA package having two concentric rows of pins is shown in FIG. 3, a PGA package may have (and usually does have) more concentric rows of pins.

The PGA package 28 of FIG. 3 may be mounted (i.e., soldered) either directly on a printed circuit board or may be preliminarily mounted in a socket 36 (FIG. 4) prior to circuit board mounting. Socket 36 includes a plurality of pin sockets 37 which correspond to pins 32 and are adapted for receiving pins 32 therein.

It will be appreciated that the decoupling capacitor of the present invention is dimensioned and configured to be mounted under a PGA package (such as the one shown in FIG. 3) in the chip cavity area either under a socket or directly under a soldered package as will be discussed in more detail below with reference to FIGS. 9A and 9B.

Turning now to FIGS. 5A–5C and 7, a decoupling capacitor in accordance with the present invention is shown generally at 26. Decoupling capacitor 26 is comprised of a dielectric material or dielectric chip 38 (see FIG. 7) sandwiched between a pair of metal conductors 40 and 42. Each conductor 40, 42 has a plurality of leads 44 and 46 which are connected thereto and extend outwardly therefrom. The leads extend outwardly a short distance and then are bent downwardly so as to extend in a direction which is perpendicular to the planes of the conductors. The entire assembly, with the exception of the plural transversely extending lead portions are then encapsulated within a suitable nonconductive material 48. The encapsulation may be laminated insulation, a molding process or any other applicable method. The conductors 40, 42 may vary in thickness and in alloy content. The dielectric 38 may be comprised of any suitable dielectric material, preferably ceramic. Preferably, a pair of standoffs 43 are formed in encapsulation 48 to permit cleaning between the decoupling capacitor and circuit board.

Figure 6B:
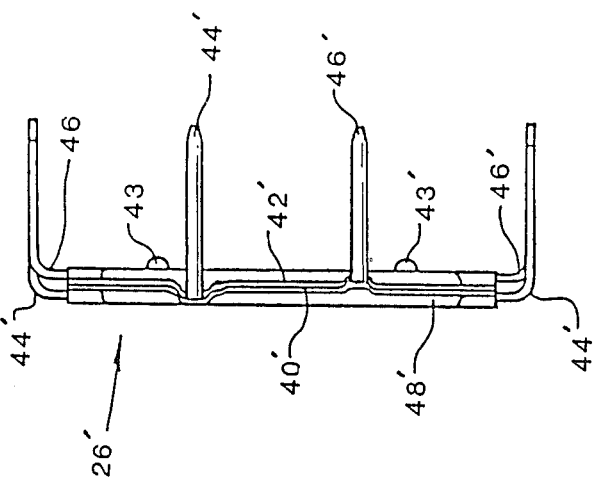
FIG. 6B is a side elevation view along the line B—B of FIG. 6A.
Figure 6A:
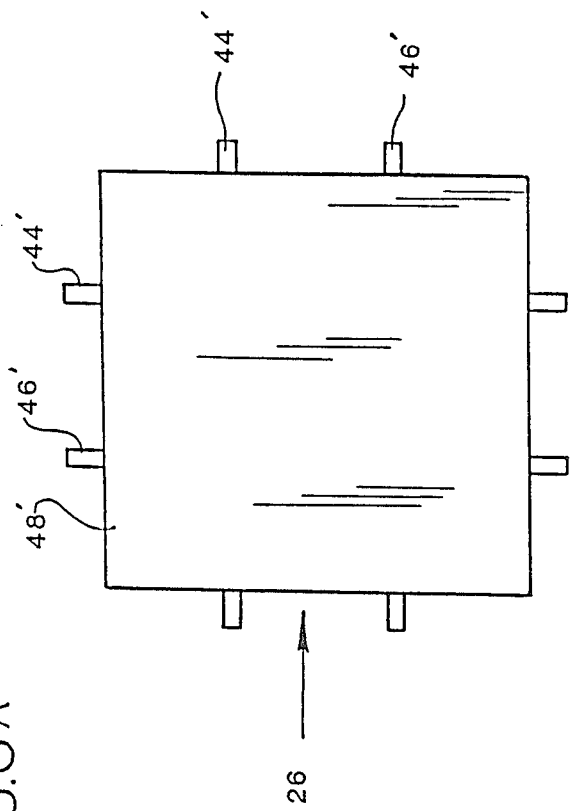
FIG. 6A is a plan view, similar to FIG. 5A, of another embodiment of a decoupling capacitor in accordance with the present invention.
Figure 6C:
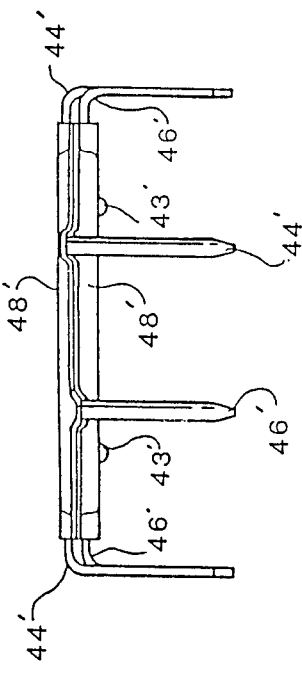
FIG. 6C is a side elevation view along the line C—C of FIG. 6A.

The decoupling capacitor 26 of FIGS. 5A–5C include a total of 14 leads 44, 46, six (6) leads 44 being connected to one conductor 40 (voltage conductor), and eight (8) leads 46 being connected to the other conductor 42 (ground conductor). However, it will be appreciated that FIGS. 5A–5C describe only one particular lead configuration which is suitable for one (or more) particular Pin Grid Array package and its unique power pin configuration. As mentioned earlier, the dimensions and pin configurations of PGA packages can differ significantly from package to package. Accordingly, an important feature of the decoupling capacitor of the present invention is that it may be easily tailored to be used in conjunction with any PGA package. For example, in FIGS. 6A–6C, an alternative embodiment of a decoupling capacitor is shown at 26'. Capacitor 26' has the same parallel plate capacitor structure of a dielectric material sandwiched between two conductors as does capacitor 26. However, unlike FIGS. 5A–5C, the decoupling capacitor 26' of FIGS. 6A–6C includes a total of 8 leads 44' and 46', four (4) leads being connected to each conductor. Also, the outer dimensions of capacitor 26' may differ from the outer dimension of capacitor 26 depending upon the dimensions of the PGA package which is being used in conjunction therewith.

Figure 8A:
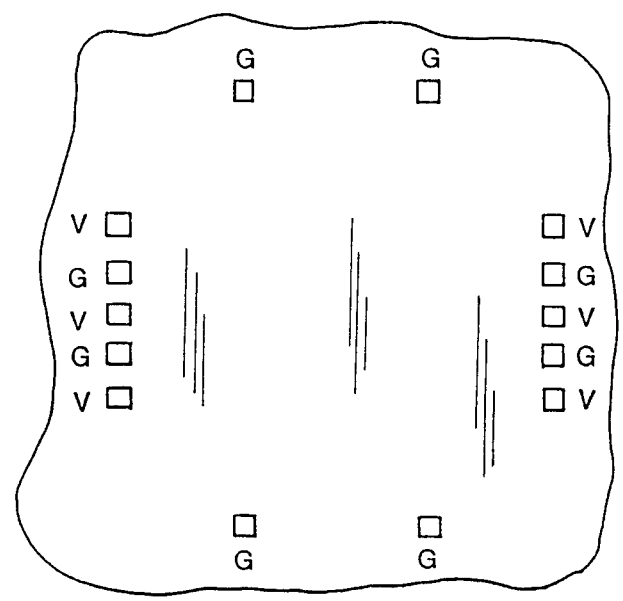
FIG. 8A is a pin designation of the inside pins of the Pin Grid Array package similar to the Pin Grid Array package of FIG. 3.
Figure 8B:
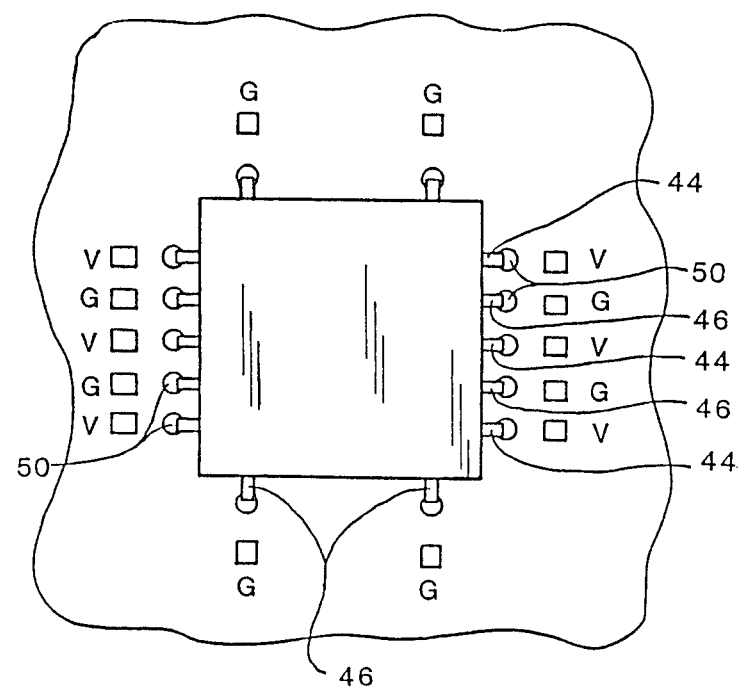
FIG. 8B is a pin designation of the decoupling capacitor of FIG. 5A connected to the inner perimeter of pins of the Pin Grid Array package of FIG. 3A.

As mentioned, the lead configuration of the decoupling capacitor of the present invention will be adapted to suit the particular needs of a selected PGA package power pin configuration. In FIG. 8A, a pin designation of the power pin configuration of a PGA package for use with the decoupling capacitor 26 of FIGS. 5A–5C is shown. FIG. 8A is thus representative of the pin configuration along the inner perimeter of pins of a PGA package such as the one described in FIG. 3. Each box in FIG. 8A represents a pin while the symbol "G" or "V" indicates whether the pin is power (voltage) or ground. Referring now to FIG. 8B, a decoupling capacitor 26 of FIGS. 5A–5C has now schematically been provided to the printed circuit board via additional holes 50. Each lead 44, 46 from capacitor 26 is matched with a corresponding voltage or ground pin from the PGA package to provide decoupling thereto. It should be understood that eight (8) leads 46 from capacitor 26 are connected to a ground conductor while the other six (6) leads 44 are connected to the voltage conductor in the capacitor.

Figure 9:
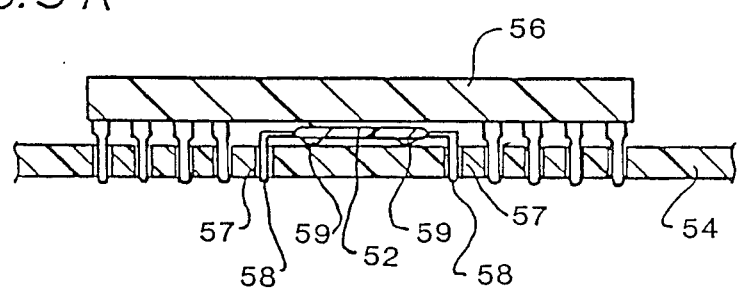
FIG. 9A. is a cross-sectional elevation view of the decoupling capacitor of the present invention mounted underneath a Pin Grid Array package on a circuit board.
FIG. 9B is a cross-sectional elevation view, similar to FIG. 9A, of an alternative method of mounting the decoupling capacitor of the present invention.
Figure 9:
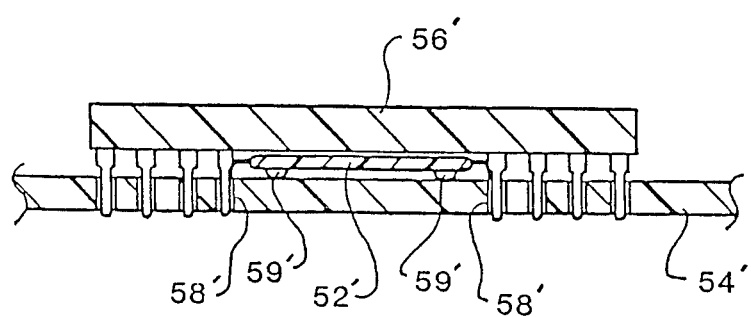

Referring now to FIG. 9A, the decoupling capacitor 52 of the present invention is shown mounted on a printed circuit board 54 underneath a PGA package 56. PGA package 54 is similar to PGA package 28 of FIG. 3, however, the PGA package 28 of FIG. 3 has been flipped over so that the pins extend downwardly through the printed circuit board 54. As discussed, enough space in the chip cavity area of the PGA package remains for the decoupling capacitor 52 of the present invention to be placed thereunder. In FIG. 9A, separate holes 57 have been provided in the circuit board 52 for receiving leads 58 therein. It will be appreciated that the leads of capacitor 52 and pins of PGA package 56 are connected either by plated through holes in a multilayer circuit board or by relatively short traces. As mentioned, the present invention is preferably provided with standoffs 59 which permit cleaning between the circuit board 54 and decoupling capacitor 52.

Turning now to FIG. 9B, an alternative method of mounting the decoupling capacitor of the present invention is shown. In FIG. 9B, the leads of capacitor 52' and pins of PGA package 56' share a circuit board hole. This method of mounting may be preferable to that shown in FIG. 9A as no additional holes need be provided to the printed circuit board 54'.

Figure 10A:
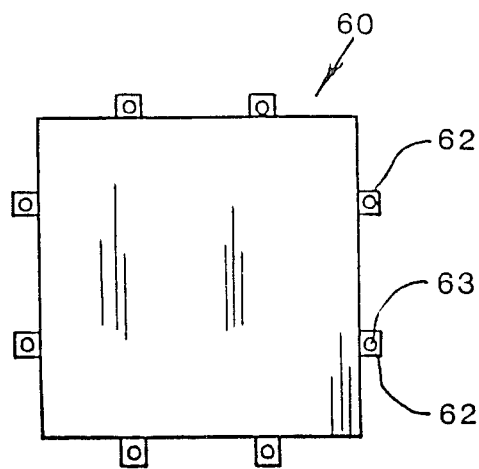
FIG. 10A is a plan view of another embodiment of a decoupling capacitor in accordance with the present invention.
Figure 10B:
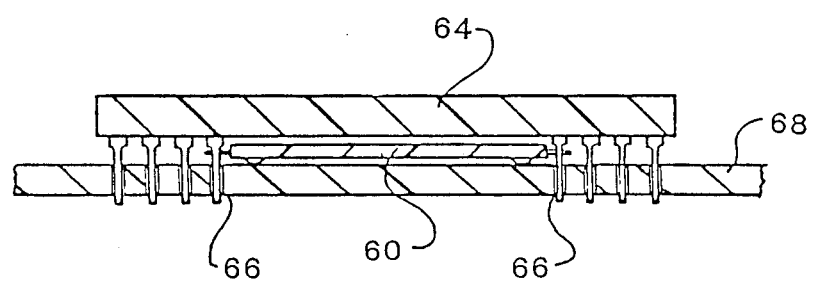
FIG. 10B a cross-sectional elevation view of the decoupling capacitor of FIG. 10A mounted underneath a Pin Grid Array package on a circuit board.

An alternative lead configuration to that discussed heretofore is shown in the decoupling capacitor 60 of FIGS. 10A and 10B. Decoupling capacitor 60 has the same structure as those described earlier except that leads 62 are formed as extended tabs, each tab having an opening 63 therethrough for receiving the pin 66 of a PGA package 64. Decoupling capacitor 60 may thus be mounted on pins 66 of PGA package 64 prior to installation on printed circuit board 68 which may ease assembly and permit the use of automatic insertion equipment.

Turning now to a discussion of prior art FIGS. 1A–B and 2A–B, in FIG. 1A, a leaded surface mounted integrated circuit (IC) chip carrier is shown generally at 70 and is electrically connected to circuit traces on multilayer printed circuit board 72 via a plurality of solder pads 74. A multilayer ceramic capacitor shown generally at 76 is also connected to multilayer circuit board 72 through solder vias 78. Multilayer circuit board 72 includes power (voltage) plane 80 and ground plane 82. Multilayer ceramic capacitor 76 is electrically connected so as to decouple leaded IC chip carrier 70 through vias 78 between the power and ground planes 80 and 82.

Figure 2A:
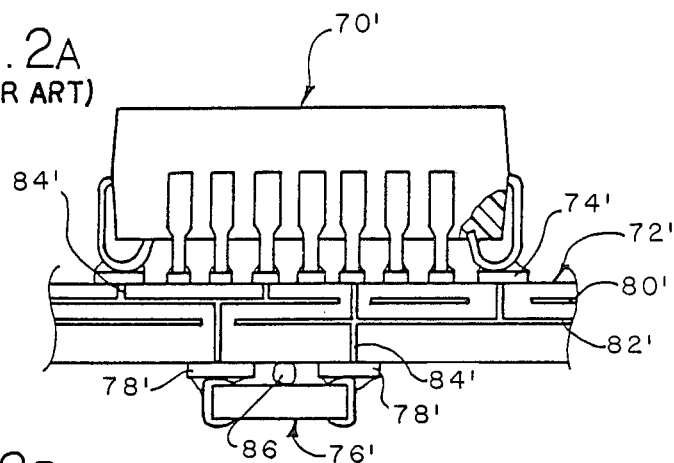
FIG. 2A is a side elevation view of a "leaded" surface mounted IC chip carrier package connected to a ceramic capacitor on the backside of a printed circuit board in accordance with the prior art.
Figure 2B:
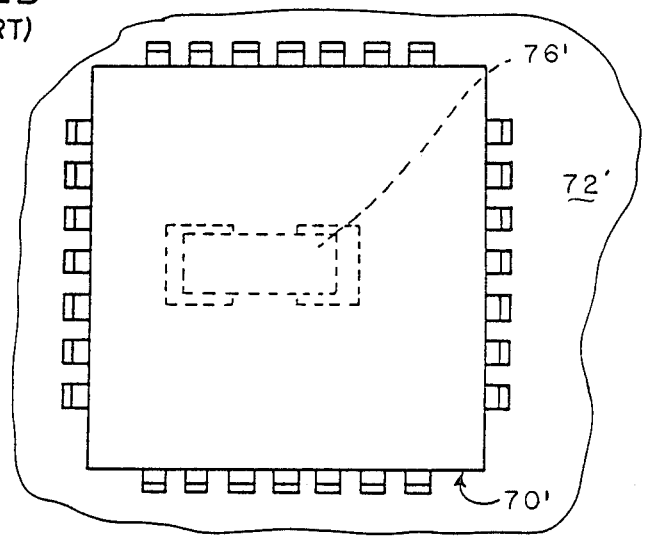
FIG. 2B is a plan view of the IC package and capacitor arrangement shown in FIG. 2A.

In FIGS. 2A and 2B, a surface mounted plastic leaded chip carrier for IC 70' is mounted on a PC board 72' in a manner similar to chip carrier 70 in FIG. 1A. However, unlike FIGS. 1A and 1B, decoupling capacitor 76' is connected to the power and ground planes 80' and 82' of circuit board 72' on the backside thereof and is held onto circuit board 72' by a suitable adhesive identified at 86.

As was discussed with regard to prior art FIG. 1 and 2, the prior art decoupling schemes of FIGS. 1A–B and 2A–B both suffer from serious deficiencies and drawbacks including high inductance in the leads and printed circuit board traces as well as inefficient use of board real estate which adversely effects component packaging density. It will be appreciated that while the decoupling scheme of FIGS. 2A and 2B improves the packaging density of the printed circuit board, this arrangement requires extra steps for PC board assembly. Such steps include application of adhesive dots 86 to hold the decoupling capacitors 76' in place while they undergo wave soldering; as well as an extra soldering step. Also, the procedure for assembling the decoupling scheme of FIG. 2 subjects both the printed circuit board and the multilayer chip capacitor to the stresses of an extra wave solder cycle (at temperatures of up to 500° F.) since the multilayer chip capacitor will be immersed in molten solder.

Figure 11:
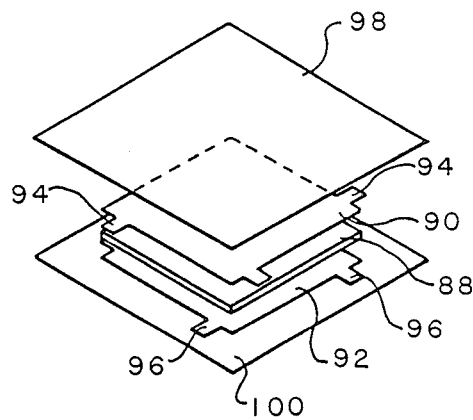
FIG. 11 is an exploded perspective view of a decoupling capacitor for surface mounting under a surface mounted IC chip carrier package of the present invention.
Figure 12:
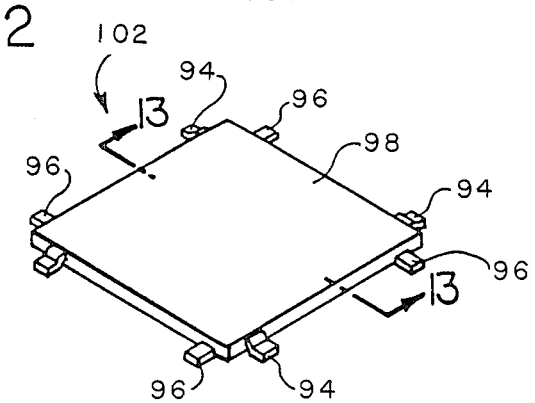
FIG. 12 is a perspective view of the decoupling capacitor of FIG. 11.
Figure 13:
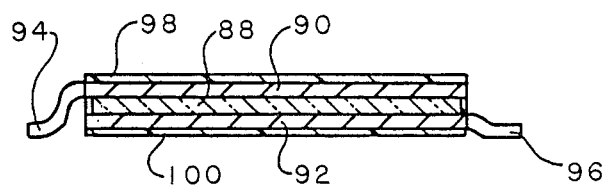
FIG. 13 is a cross-sectional elevation view along the line 13—13 of FIG. 12.

These important problems are overcome by the novel decoupling capacitor of the present invention which is dimensioned and configured specifically to be used in conjunction with a surface mounted plastic leaded chip carrier package for integrated circuits. Referring first to FIGS. 11–13, the surface mountable decoupling capacitor in accordance with this embodiment of the present invention comprises a dielectric material or dielectric chip 88 sandwiched between a pair of metal conductors 90 and 92. Each conductor 90, 92 has a plurality of leads 94 and 96 which are connected thereto and extend outwardly therefrom. It will be appreciated that each of the leads 94 and 96 terminate in a flat, planar configuration so as to be surface mountable onto a printed circuit board. Preferably, dielectric material 88 is a metallized plate of a dielectric ceramic material which is attached to conductors 90 and 92 by a conductive adhesive, or solder, or any other appropriate method. The entire assembly is then insulated or encapsulated with only the leads 94 and 96 extending through the insulation. By way of example, the embodiment of the present invention shown in FIGS. 11–13 includes two layers of insulating material 98 and 100. The assembly as shown in FIG. 11 is then laminated under heat and pressure to effect a hermetic seal. Alternatively, the assembly (comprising the dielectric layer 88 sandwiched by conductors 90 and 92) may be encapsulated by transfer or injection molding or by any other appropriate method.

Following lamination, encapsulation or other appropriate sealing method, leads 94 and 96 are formed into the surface mounting shape to provide the final decoupling capacitor configuration identified at 102 in FIG. 12. It will be appreciated that decoupling capacitor 102 may be packaged and transported in plastic tubes or similar packages which are suited for handling automatic surface placing equipment similar to automated insertion equipment utilized by integrated circuit packages.

Referring now to FIG. 15, the decoupling capacitor 102 of FIGS. 11–13 is shown mounted on a rigid circuit board 104 underneath a leaded surface mounted chip carrier for integrated circuits identified at 106. Surface mounted leaded chip carrier packages for integrated circuits of the type shown at 106 in FIG. 15 are well known and include a plurality of power, ground and signal pins 108 which are electrically and mechanically attached to printed circuit board 104 via solder pads 110 using a reflow solder process or the like. In accordance with the present invention, and as shown in FIG. 14, selected power and ground solder pads 110 for chip carrier 106 are extended beneath the chip carrier to permit access of power and ground leads 94 and 96 of decoupling capacitor 102. It will be appreciated that in FIG. 14, the outer perimeter of a conventional chip carrier is schematically shown by the dotted lines 112. Further, conventional solder pads 110 are shown with the extended solder pads 110′ interspersed between solder pads 110 provided at locations where leads 94 and 96 of decoupling capacitor 102 will make contact.

The decoupling capacitor 102 of FIGS. 11-15 include a total of eight leads 94 and 96, four leads 94 being connected to top conductor 90, and four leads 96 being connected to bottom conductor 92. However, it will be appreciated that FIGS. 11-15 describe only one particular lead configuration which is suitable for one (or more) particular surface mounted IC chip carrier and its unique power and ground pin configuration. As mentioned with regard to the decoupling capacitor for PGA packages, the dimensions and pin configurations of the decoupling capacitor of the present invention may differ significantly from one particular chip carrier configuration to another. Accordingly, an important feature of the surface mountable decoupling capacitor of the presen invention is that it may be easily tailored to be used in conjunction with any surface mounted IC chip carrier. It will further be appreciated that the top and bottom conductors 90 and 92 of decoupling capacitor 102 correspond to power (voltage) and ground pins of chip carrier 106. Accordingly, the leads 94 and 96 will be either power or ground leads and will correspond to the power and ground leads 108 which extend from chip carrier 106.

Decoupling capacitor 102 of the present invention must have a thickness and configuration which permits its placement underneath the leaded chip carrier 106 and between printed circuit board 104. Preferably, decoupling capacitor 102 is provided with set off means 112 which permits cleaning between circuit board 104 and decoupling capacitor 102.

Figure 1C:
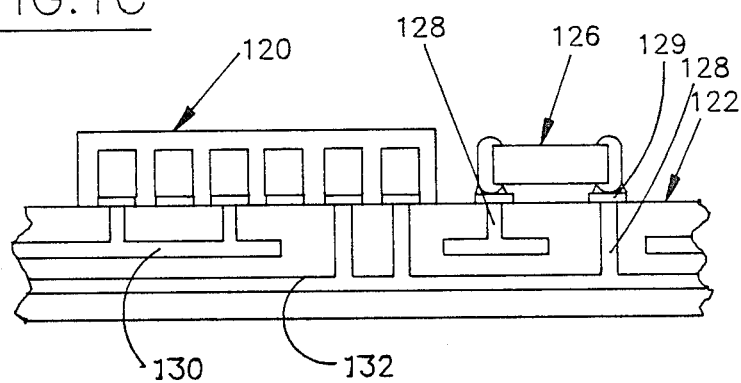
FIG. 1C is a side elevation view of a "leadless" surface mounted IC chip carrier package connected to a ceramic capacitor via plated through holes and internal planes in accordance with the prior art.
Figure 1D:
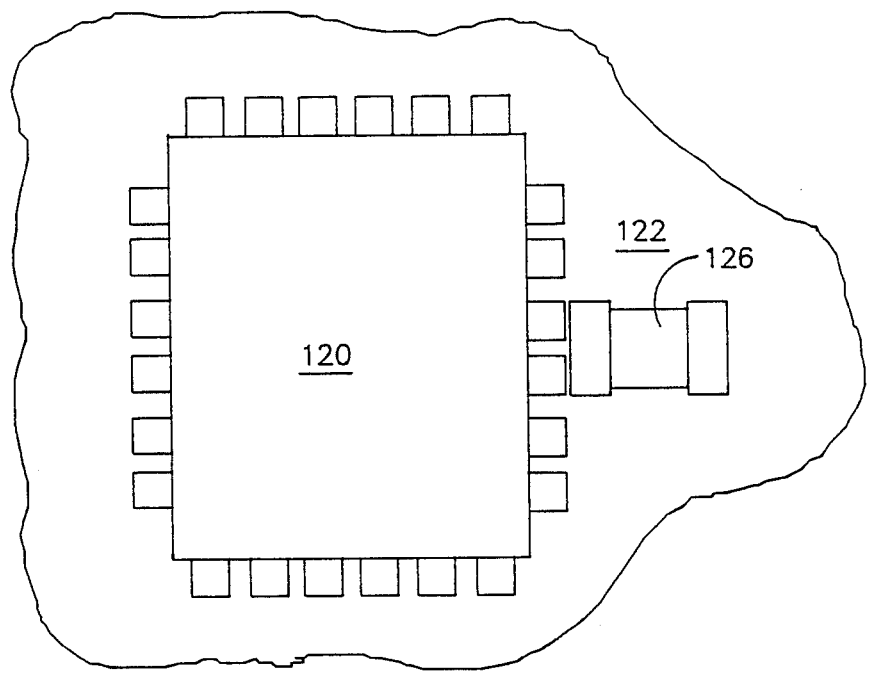
FIG. 1D is a plan view of the IC package and capacitor arrangement shown in FIG. 1C.

Turning now to a discussion of prior art FIGS. 1C-D and 2C-D, in FIG. 1C, a leadless surface mounted integrated circuit (IC) chip carrier is shown generally at 120 and is electrically connected to circuit traces on multilayer printed circuit board 122 via a plurality of solder pads 124. A multilayer ceramic capacitor shown generally at 126 is also connected to multilayer circuit board 122 through solder vias 128 by a plurality of solder pads 129. Multilayer circuit board 122 includes power (voltage) plane 130 and ground plane 132. Multilayer ceramic capacitor 126 is electrically connected so as to decouple leadless IC chip carrier 120 through vias 128 between the power and ground planes 130 and 132.

In FIGS. 2C and 2D, a surface mounted plastic leadless chip carrier for IC 120′ is mounted on a PC board 122′ in a manner similar to chip carrier 120 in FIG. 1C. However, unlike FIGS. 1C and 1D, decoupling capacitor 126′ is connected to the power and ground planes 130′ and 132′ of circuit board 122′ on the backside thereof and is held onto circuit board 122′ by a suitable adhesive identified at 136.

As was discussed with regard to prior art FIGS. 1, 1A-B, 2 and 2A-B, the prior art decoupling schemes of FIGS. 1C-D and 2C-D both suffer from serious deficiencies and drawbacks including high inductance in the leads and printed circuit board traces as well as inefficient use of board real estate which adversely effects component packaging density. It will be appreciated that while the decoupling scheme of FIGS. 2C and 2D improves the packaging density of the printed circuit board, this arrangement requires extra steps for PC board assembly. Such steps include application of adhesive dots 136 to hold the decoupling capacitors 126′ in place while they undergo wave soldering; as well as an extra soldering step. Also, the procedure for assembling the decoupling scheme of FIG. 2C-D subjects both the printed circuit board and the multilayer chip capacitor to the stresses of an extra wave solder cycle (at temperatures of up to 500° F.) since the multilayer chip capacitor will be immersed in molten solder. These important problems are overcome by the novel decoupling capacitor of the present invention which is dimensioned and configured specifically to be used in conjunction with a surface mounted leadless chip carrier package for integrated circuits.

Figure 7:
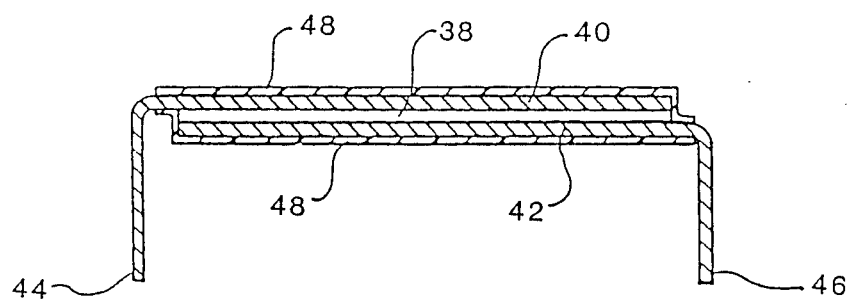
FIG. 7 is a cross-sectional elevation view along the line 7—7 of FIG. 5A.

It will be appreciated that from a structural standpoint, the decoupling capacitor for leadless chip carriers of the present invention may be quite similar to either the decoupling capacitor of FIGS. 5-7 for PGA packages; or the decoupling capacitor of FIGS. 11-15 for surface mounted leaded chip carriers. A key distinction is that the decoupling capacitor for leadless chip carriers must be dimensionally configured for positioning over the IC carrier package as opposed to under the IC carrier. This means that the leads extending from the decoupling capacitor must be long enough to contact the printed circuit board solder pads.

Figure 16:
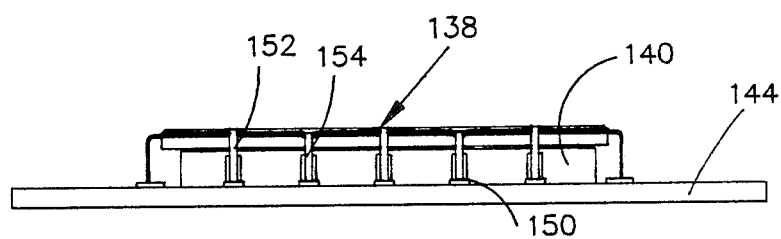
FIG. 16 is a side elevation view showing the decoupling capacitor of FIG. 5A–C mounted over a leadless surface mounted IC chip carrier package in accordance with the present invention.
Figure 17:
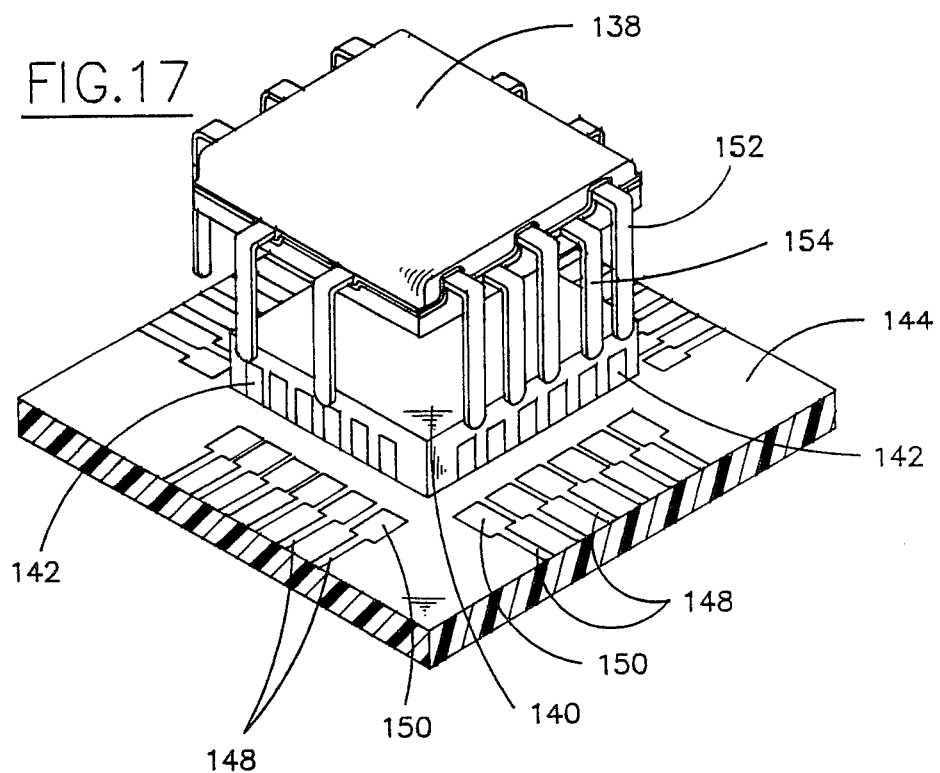
FIG. 17 is an exploded perspective view of the elements of FIG. 16 prior to assembly.

Turning now to FIGS. 16 and 17, the decoupling capacitor of FIGS. 5A-C is shown at 138 adapted for use in conjunction with a leadless chip carrier (LCC) 140 of known construction. As mentioned, the construction of leadless chip carrier 140 is well known and includes an integrated circuit within a dielectric housing (typically plastic). The integrated circuit (not shown) within the housing of the LCC is connected to a plurality of metallized solder connects 142 positioned on the outside of LCC 140. Printed wiring board 144 is comprised of a nonconductive substrate having a circuit pattern 148 thereon. At selected areas on circuit pattern 148, the pattern terminates at solder pads 150. It will be appreciated that solder connects 142 on leadless chip carrier 140 will mechanically and electrically connect to solder pads 150 of printed circuit pattern 148 via a reflow or other known process.

In accordance with the present invention, decoupling capacitor 138 is mounted over leadless chip carrier 140 and thereafter connected to selected solderpads 150 on printed wiring board 144. Like the previously described decoupling capacitors for PGA packages or leaded surface mounted chip carriers, decoupling capacitor 138 has flexible lead locations and multiple pins or leads corresponding to each voltage level of the leadless chip carrier 140. However, the structure of capacitor 138 must be dimensionally configured to be mounted over LCC 140; and therefore leads 152 and 154 must extend far enough to effect connection with solder pads 150.

Turning now to FIGS. 18-21, in an alternative embodiment, decoupling capacitor 138 of FIGS. 16 and 17 may be configured in a manner similar to the decoupling capacitor of FIGS. 11-13. Thus, in FIGS. 18 and 19, decoupling capacitor 138′ comprises a pair of conductors 156 and 158 sandwiching therebetween a suitable dielectric (i.e., ceramic) material 160. A suitable number of leads 162 and 164 are preferably especially configured for surface mounting with the incorporation of flattened, planar terminations 166 and 168, respectively. Protective layers of insulative material (encapsulation) 170 and 172 are provided on the exterior surfaces of conductors 156 and 158 with leads 162 and 164 extending outwardly thereof.

Figure 18:
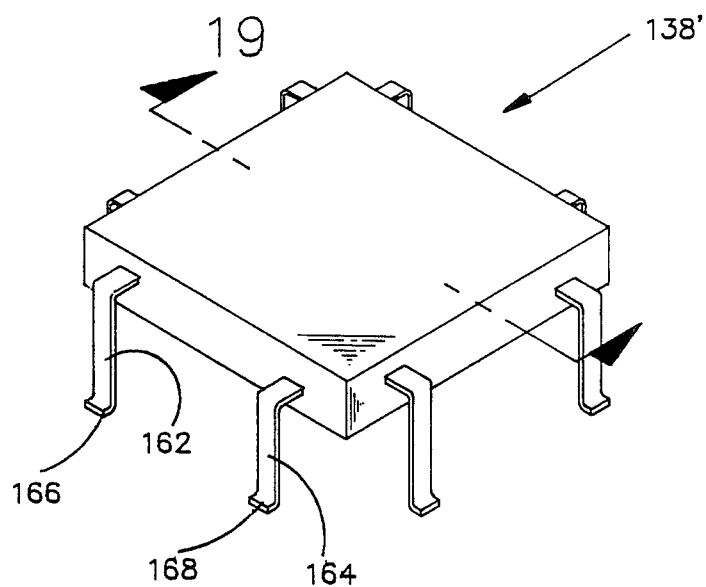
FIG. 18 is a perspective view of a decoupling capacitor, similar to that shown in FIGS. 11–13, for use with a leadless surface mount IC chip carrier package.
Figure 19:
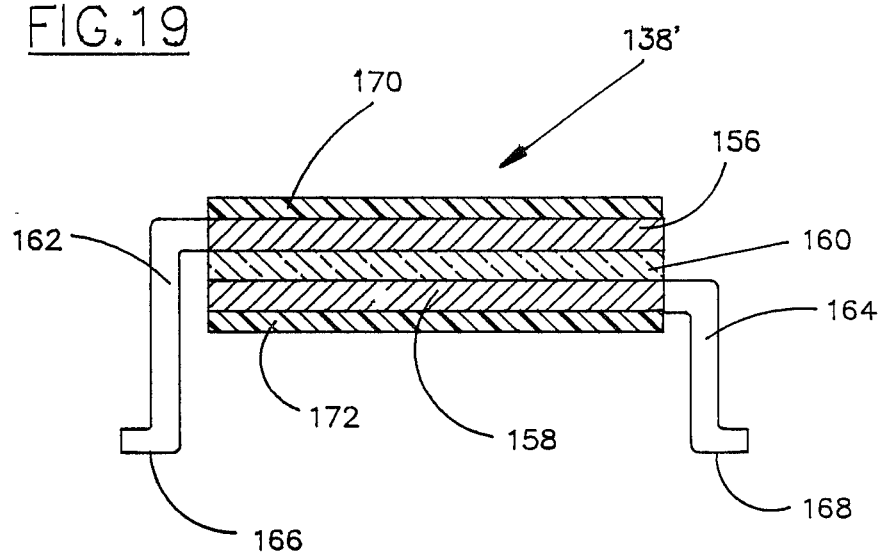
FIG. 19 is a cross-sectional elevation view along the lines 19—19 of FIG. 18.
Figure 20:
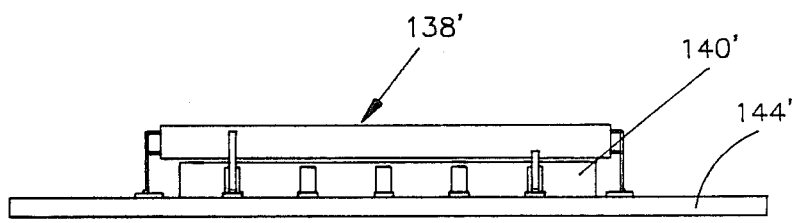
FIG. 20 is a side elevation view showing the decoupling capacitor of FIGS. 18–19 mounted over a leadless chip carrier package in accordance with the present invention.
Figure 21:
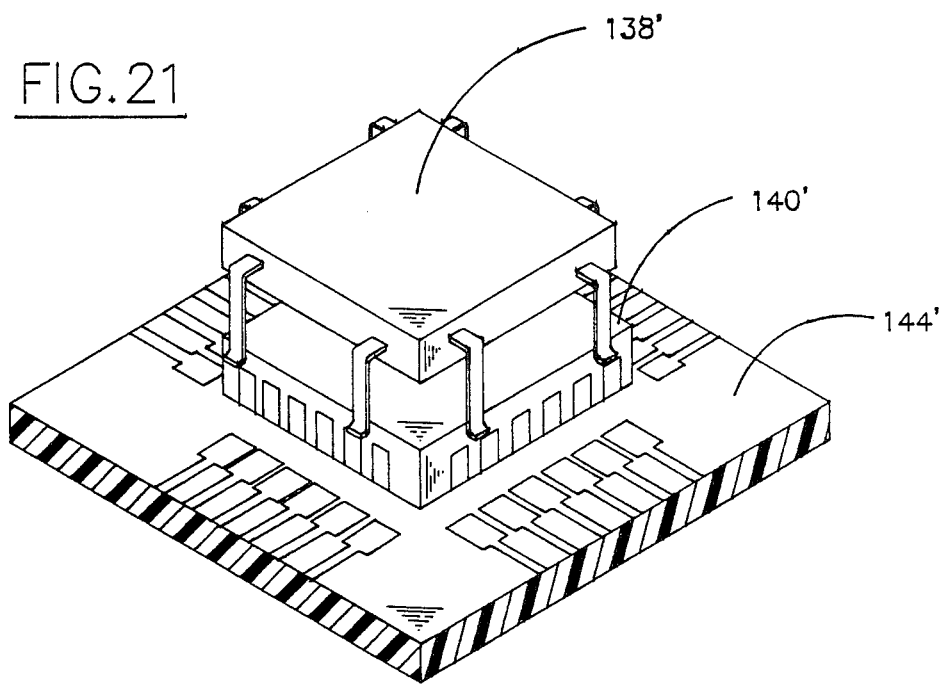
FIG. 21 is an exploded perspective view showing the assembly of FIG. 20.

In FIGS. 20 and 21, the decoupling capacitor 138' of FIGS. 18 and 19 is shown mounted directly over LCC 140' in an identical manner to the assembly described in FIGS. 16 and 17.

The decoupling capacitor for use in conjunction with Pin Grid Array packages and surface mounted leaded and leadless chip carriers of the present invention has many features and advantages not found in the prior art. For example, by mounting a flat decoupling capacitor directly under a PGA package or leaded chip carrier, or over a leadless chip carrier, the result will be a lower inductance decoupling loop, thus providing a more effective decoupling scheme. This alleviates many of the problems associated with the high inductance of the prior art decoupling schemes of FIGS. 1, 2, 1A-B, 2A-B, 1C-D and 2C-D.

The present invention also permits a reduction in the amount of circuit board "real estate" occupied by the prior art decoupling devices of FIGS. 1, 2, 1A-B, 2A-B, 1C-D and 2C-D. The need to save circuit board space to permit higher component mounting density is presently an important concern to those skilled in the art of electronic circuit design. Accordingly, the present invention addresses this problem by employing the novel mounting of decoupling capacitors underneath PGA and surface mounted leaded chip carrier packages; and over surface mounted leadless chip carrier packages.

Also, the decoupling capacitors of the present invention provide heat removal from the chip carrier or PGA package by enhancing the thermal conductivity of the region under or over the chip carrier or PGA package.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoupling capacitor for use with a leadless surface mounted integrated circuit chip carrier package, the leadless chip carrier adapted for mounting on a circuit board and having an array of conductive connecting means arranged exteriorly on the perimeter thereof, at least some of the connecting means being first and second voltage level connecting means, the capacitor including:
   a flat dielectric body having a pair of opposed surfaces;
   a first conductor on one of said opposed surfaces of said dielectric body defining a first voltage level conductor;
   a second conductor on the other of the said opposed surfaces of said dielectric body defining a second voltage level conductor;
   a plurality of first leads in a predetermined configuration in electrical contact with said first conductor and extending outwardly therefrom;
   a plurality of second leads in a predetermined configuration in electrical contact with said second conductor and extending outwardly therefrom;
   the configurations of said first and second leads corresponding to configurations of first and second voltage levels of said connecting means of said leadless chip carrier package;
   an insulating material surrounding said dielectric body and conductors, said first and second leads extending though said insulating material; an
   said dielectric body, first conductor, second conductor and insulating material defining an insulated assembly, said plurality of first and second leads having a length and configuration to effect electrical contact with a circuit board when said insulated assembly is mounted over the leadless chip carrier package.

2. The capacitor of claim 1 wherein:
   said insulated assembly is substantially rectangular.

3. The capacitor of claim 2 wherein:
   said insulated assembly is substantially square.

4. The capacitor of claim 1 wherein said dielectric body includes:
   a pair of metallized layers on said opposed surfaces thereof, said metallized layers contacting said first or second conductors.

5. The capacitor of claim 1 wherein:
   said dielectric body is bonded to said first and second conductors.

6. The capacitor of claim 1 wherein:
   said first and second leads terminate as flattened configurations for surface mounting on a circuit board.

7. The subassembly of claim 6 wherein;
   said dielectric body is bonded to said first and second conductors.

8. An electronic subassembly comprising:
   a leadless surface mounted integrated circuit chip carrier package, said chip carrier package adapted for surface mounting on a circuit board and having an array of conductive connecting means arranged exteriorly on the perimeter thereof, at least some of the connecting means being first and second voltage level connecting means;
   a circuit board, said circuit board having first spaced surface pads receiving said leadless chip carrier package connecting means;
   decoupling capacitor means, said decoupling capacitor means being aligned with and mounted over said chip carrier package and electrically communicating with said first spaced surface pads of said circuit board, said capacitor means comprising;
   a flat dielectric body having a pair of opposed surfaces;
   a first conductor on one of said opposed surfaces of said dielectric body defining a first voltage level conductor;
   a second conductor on the other of the said opposed surfaces of said dielectric body defining a second voltage level conductor;
   a plurality of first leads in a predetermined configuration in electrical contact with said first conductor and extending outwardly therefrom;
   a plurality of second leads in a predetermined configuration in electrical contact with said second conductor and extending outwardly therefrom;
   the configurations of said first and second leads corresponding to configurations of first and second voltage levels of said connecting means of said leadless chip carrier package; and
   said dielectric body, first conductor, second conductor and insulating material defining an insulated assembly, said plurality of first and second leads having a length and configuration to effect electrical contact with a circuit board when said insulated assembly is mounted over the leadless chip carrier package.

9. The subassembly of claim 8 wherein:
said insulated assembly is substantially rectangular.

10. The subassembly of claim 8 wherein:
said insulated assembly is substantially square.

11. The subassembly of claim 8 wherein said first spaced sufface pads include: pad extensions for receiving said first and second voltage level leads of said decoupling capacitor.

12. The subassembly of claim 8 wherein said dielectric body includes:
a pair of metallized layers on said opposed surfaces thereof, said metallized layers contacting said first or second conductors.

13. The subassembly of claim 8 wherein:
said first and second leads terminate as flattened configurations for surface mounting on a circuit board.

* * * * *